United States Patent
Rengarajan et al.

(10) Patent No.: US 10,432,436 B1
(45) Date of Patent: Oct. 1, 2019

(54) FEED FORWARD EQUALIZER WITH POWER-OPTIMIZED DISTRIBUTED ARITHMETIC ARCHITECTURE AND METHOD

(71) Applicant: GLOBALFOUNDRIES INC., Grand Cayman (KY)

(72) Inventors: Krishnan S. Rengarajan, Bengaluru (IN); Vaibhav A. Ruparelia, Bengaluru (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/216,248

(22) Filed: Dec. 11, 2018

(51) Int. Cl.
*G06F 1/3203* (2019.01)
*H04L 25/03* (2006.01)
*H03M 7/42* (2006.01)
*H03K 19/177* (2006.01)
*H04L 27/01* (2006.01)

(52) U.S. Cl.
CPC ...... *H04L 25/03878* (2013.01); *G06F 1/3203* (2013.01); *H03K 19/17728* (2013.01); *H03M 7/42* (2013.01); *H04L 27/01* (2013.01)

(58) Field of Classification Search
CPC . H04L 25/03878; H04L 27/01; G06F 1/3203; H03M 7/42; H03K 19/17728
See application file for complete search history.

(56) References Cited

U.S. PATENT DOCUMENTS

| | | | | |
|---|---|---|---|---|
| 3,579,109 | A * | 5/1971 | Hatley | H04L 25/03038 375/236 |
| 5,532,938 | A * | 7/1996 | Kondo | G06F 9/3885 708/524 |
| 7,107,301 | B2 | 9/2006 | Rylov et al. | |
| 8,238,467 | B2 | 8/2012 | Dally | |
| 8,311,147 | B2 | 11/2012 | Dally | |

(Continued)

OTHER PUBLICATIONS

Keerthi et al., "FPGA Implementation of Distributed Arithmetic for FIR Filter," International Journal of Engineering Research & Technology (IJERT), vol. 1, Issue 9, 2012, pp. 1-8.

(Continued)

*Primary Examiner* — Dac V Ha
(74) *Attorney, Agent, or Firm* — Gibb & Riley, LLC; David A. Cain, Esq.

(57) ABSTRACT

A distributed arithmetic feed forward equalizer (DAFFE) and method. The DAFFE includes look-up tables (LUTs) in offset binary format. A DA LUT stores sum of partial products values and an adjustment LUT stores adjustment values. DA LUT addresses are formed from same-position bits from all but the most significant bits (MSBs) of a set of digital words of taps and an adjustment LUT address is formed using the MSBs. Sum of partial products values and an adjustment value are acquired from the DA LUT and the adjustment LUT using the DA LUT addresses and the adjustment LUT address, respectively. Reduced complexity downstream adder(s) (which result in reduced power consumption) compute a total sum of the sum of partial products values and the adjustment value (which compensates for using the offset binary format and dropping of the MSBs when forming the DA LUT addresses) to correctly solve a DA equation.

20 Claims, 6 Drawing Sheets

(56) References Cited

U.S. PATENT DOCUMENTS

| | | | |
|---|---|---|---|
| 8,750,365 B1* | 6/2014 | Sarca | H04L 27/01 375/232 |
| 9,036,689 B2 | 5/2015 | Bae et al. | |
| 2003/0091129 A1* | 5/2003 | Zhang | H03M 13/2975 375/340 |
| 2005/0201457 A1 | 9/2005 | Allred et al. | |

OTHER PUBLICATIONS

Smruti Santa Swain, "Implementation of FIR Filter using Distributed Arithmetic Method," Thesis, National Institute of Technology Rourkela, Department of Electronics and Communications Engineering, 2015, pp. 1-40.

Hwang et al., "New Distributed Arithmetic Algorithm for Low-Power FIR Filter Implementation," IEEE Signal Processing Letters, vol. 11, No. 5, 2004, pp. 463-466.

Zhou et al., "A Low Power FIR Filter Structure Based on a Modified Distributed Arithmetic Algorithm," College of Information Science and Engineering, Ningbo University, The Key Program of National Science of China (No. 61131001), pp. 1-4.

Raghunadha Reddy et al., "ASIC Implementation of Distributed Arithmetic in Adaptive FIR Filter," International Conference on Circuits Power and Computing Technologies (ICCPCT), 2017, pp. 1-4.

Chen et al., "Power Optimized ADC-Based Serial Link Receiver," IEEE Journal of Solid-State Circuits, vol. 47, No. 4, 2012, pp. 938-951.

Bowlyn et al., "A Novel Distributed Arithmetic Multiplierless Approach for Computing Complex Inner Products," International Conference on Parallel and Distributed Processing Techniques and Applications, 2015, pp. 606-612.

Mohammad Al Mandi Eshtawie, "Distributed Arithmetic Technique Analysis, Design and Applications," The Second Symposium on Theories and Applications of Basic and Biosciences, 2015, pp. 56-65.

Hanumolu et al., "Equalizers for High-Speed Serial Links," International Journal of High Speed Electronics and Systems, vol. 15, No. 2, 2005, pp. 175-204.

Patil et al., "An Analysis on FIR Filter-Efficiency (FFE)," International Journal of Electrical, Electronics and Computer Systems (IJEECS), 2016, Abstract.

Naik et al., "An Efficient Reconfigurable FIR Digital Filter Using Modified Distribute Arithmetic Technique," International Journal of Emerging Technology and Advanced Engineering, vol. 5, Issue 6, 2015, pp. 152-156.

Sridharan et al., "Introduction to Distributed Arithmetic," www.ee.iitm.ac.in/vlsi/_media/iep2010/da.pdf, Accessed on Oct. 30, 2018, pp. 1-24.

Stanley A. White, "Applications of Distributed Arithmetic to Digital Signal Processing: A Tutorial Review," IEEE ASSP Magazine, 1989, pp. 4-19.

Yazhini et al., "FIR Filter Implementation using Modified Distributed Arithmetic Architecture," Indian Journal of Science and Technology, vol. 6, Issue 5, 2013, 4485-4491.

Zhang et al., "PAM4 Signaling for 56G Serial Link Applications—A Tutorial," UBM Design Con, 2016, pp. 1-91.

* cited by examiner

FEED FORWARD EQUALIZER WITH POWER-OPTIMIZED DISTRIBUTED ARITHMETIC ARCHITECTURE AND METHOD

BACKGROUND

Field of the Invention

The present invention relates to feed forward equalizers (FFEs) for data link receivers and, more particularly, to a FFE with a novel distributed arithmetic architecture for reduced power consumption and a corresponding feed forward equalization method.

Description of Related Art

A feed forward equalizer (FFE) is often incorporated into a data link receiver (RX), such as a level-4 pulse amplitude modulation (PAM-4) data receiver, to correct for signal degradation. Specifically, those skilled in the art will recognize that a PAM-4 signal includes four distinct pulse amplitudes at different levels and used to convey information. Each of the four different amplitude levels corresponds to a different pair of bits (i.e., 00, 01, 11, and 10, respectively). Transmission, by a data link transmitter (TX), of a signal with one of the four amplitudes in a given period effectively represents the transmission of two data bits, in parallel, such that the data transmission rate is doubled relative to PAM-2 (also called Non-Return to Zero or NRZ transmission). FIG. 1A illustrates an exemplary PAM-4 signal transmitted by a TX. Of note is the distinctive "eye pattern" of this PAM-4 signal. Such a PAM-4 signal is, however, particularly susceptible to noise degradation during transmission. FIG. 1B illustrates signal loss at at the RX, as evidenced by the closing of the eye pattern. Within the RX, the PAM-4 signal is processed firstly by an Analog Front End (AFE), which can include, but is not limited to, an amplifier and a Continuous Time Linear Equalizer (CTLE). The output of the AFE is further equalized significantly by an FFE to correct for signal loss before undergoing any further processing.

An analog FFE, as illustrated in FIG. 2, employs a finite impulse response (FIR) filter. The FIR filter incorporates an n-stage delay line 210 that passes a received analog signal successively through delay elements $201_{1-n}$. Taps $202_{0-n}$ on the delay line 210 before and after each delay element $201_{1-n}$ feed into corresponding multipliers $203_{0-n}$. Each of the multipliers $203_{0-n}$ multiplies the received data by a corresponding tap weight $A_{0-n}$ (also known as a filter coefficient or tap coefficient) to obtain partial products. The taps weights are predetermined to compensate for the impulse response and, by duality, the frequency response. The products are then fed into downstream adder logic (including one or more adders 204) and the output of the FIR filter is a sum of the products. In other words, the output of the FIR filter (i.e., the FFE) is the result of a series of n+1 multiply and accumulate (MAC) operations.

A digital FFE (e.g., a distributed arithmetic (DA) FFE) can perform this same FIR filter function, but can do so in a more time efficient manner by converting the signal from analog to digital and then processing the signal digitally. In a receiver that employs a DAFFE, the received analog signal is processed by the AFE and then digitized by an Analog to Digital Converter (ADC). The digital output of the ADC is then equalized significantly by the DA FEE to correct for signal loss before undergoing any further processing in the digital domain. In the DA FEE, the MAC operations are not performed real time. Instead all possible outcomes of the MAC operations (i.e., pre-computed sums of partial products values) are stored in look-up-tables (LUT) and accessed using LUT addresses generated using the ADC digital outputs. More specifically, the ADC digital outputs (also referred to herein as signal taps) and the filter coefficients are in binary arithmetic format and hence every product of a signal tap and a filter coefficient is a binary arithmetic multiplication. Distributed arithmetic reorganizes the multiplication math across multiple signal taps by the weight of the position of a digit in the binary number and by using the combination of these same-position digits as an index (also referred to herein as an LUT address). Each LUT address is used to fetch a pre-computed sum of partial products value from a LUT, which store all possible sum of partial products values of the tap signals' digitized with their respective tap coefficients in binary form. While currently available DAFFE architectures are suitable for performing the required equalization process within receivers, improvements and/or modifications that enable device size scaling, power optimization and faster operating speeds are generally considered desirable.

SUMMARY

In view of the foregoing, disclosed herein are embodiments of a feed forward equalizer with a power-optimized distributed arithmetic (DA) architecture. The DAFFE can receive digital words, each having an equal number of bits (e.g., N-bit words) from, for example, multiple analog-to-digital converters (ADCs).

The DAFFE can further include at least one set of look-up tables (LUTs) in binary offset format and an address generator for generating addresses to acquire data from these LUTs.

Specifically, the set of LUTs can include at least one distributed arithmetic (DA) look-up table (LUT) and an adjustment LUT for each DA LUT. The DA LUT can store pre-calculated possible outcomes for sum of partial products computations. The adjustment LUT can store pre-calculated possible outcomes for correction plus offset computations.

For a predetermined number of digital words that are received by DAFFE at successive unit intervals, the address generator can generate multiple DA LUT addresses and an adjustment LUT address. Specifically, the address generator can generate DA LUT addresses from a group of least significant bits (LSBs) of the predetermined number of digital words through a group of next-to-most significant bits (next-to-MSBs) of those same digital words, respectively. Specifically, a group of bits made up of the LSBs of the predetermined number of digital words are combined by the address generator to form one DA LUT address for accessing a sum of partial products value for that LSB position, a group of bits made up of the next-to-LSBs of the same digital words are combined by the address generator to form another DA LUT address for accessing another sum of partial products value for that next-to-LSB position, and so on until a group of bits made up of the next-to-MSBs of the same digital words are modified and then combined by the address generator to form a DA LUT address for accessing another sum of partial products value for that next-to-MSB position. As mentioned above, in the present invention, the most significant bits (MSBs), which represent signal polarity only (i.e. not signal magnitude), are dropped when forming the DA LUT addresses. To compensate for a magnitude reduction in the final output, due to this dropping of the MSBs when generating the DA LUT addresses, the next-to-MSBs are specifically modified to their inverted value before being combined to form the corresponding DA LUT address for the next-to-MSB position.

The address generator can further generate an adjustment LUT address from a group of bits made up of the most significant bits (MSBs) of the same digital words used to form the DA LUT addresses, discussed above, for accessing an adjustment value (i.e., a correction plus offset value) from the adjustment LUT.

The address generator can further process the above-mentioned LUT addresses, which are in standard binary formation, to enable use with the DA and adjustment LUTs, which are in the offset binary format. That is, the address generator can convert or map the above-mentioned LUT addresses from the standard binary to the offset binary format in order to acquire data from the LUTs, which are in the offset binary format. Specifically, standard binary DA LUT addresses can be converted or mapped by the address generator to offset binary DA LUT addresses. The offset binary DA LUT addresses can be received, as inputs, by the DA LUT and, in response, the DA LUT can output sum of partial products values that were stored at the addressed locations. Similarly, the standard binary adjustment LUT address can be converted or mapped by the address generator to an offset binary adjustment LUT address. The offset binary adjustment LUT address can be received, as an input, by the adjustment LUT and, in response, the adjustment LUT can output an adjustment value that was stored at the addressed location. Thus, all accessed sums of partial products values and the adjustment value will be associated with the same digital words.

The DAFFE can further include at least one adder that can add together (i.e., compute the total sum of) the sum of partial products values acquired from the DA LUT and the adjustment value acquired from the adjustment LUT to solve a DA equation.

It should be noted that the adjustment value is included in the DA equation and incorporates both a correction component and an offset component in order to compensate for reduction in size of the DA LUT due to the dropping of the MSBs and the use of the offset binary format, respectively. Additionally, it should be noted that, as a result of this DAFFE configuration and, particularly, the reduced number of sum of partial products values acquired from the DA LUT due to the dropping of the MSBs when generating the DA LUT addresses, there is a corresponding reduction in the downstream adder logic complexity required to solve the DA equation and, thereby a corresponding reduction in power consumption when processing the data from the DA LUT.

Embodiments of the DAFFE can include multiple DAFFE slices (as described above) that operate in parallel to process different groups of digital inputs (e.g., from sub-stantially overlapping sub-sets of analog-to-digital converters (ADCs) within a larger set of ADCs). Additionally, embodiments of the DAFFE can include multiple sets of the above-described LUTs in a single DAFFE slice to allow for parallel processing of relatively small groups of digital inputs, which have been sampled from a given sub-set of the larger set of ADCs.

For example, a particular embodiment of the DAFFE can include sixteen DAFFE slices that operate in parallel to process sixteen different groups of digital words (e.g., from sixteen substantially overlapping sub-sets of ADCs within a larger set of thirty-two ADCs 0-32). For example, one slice can receive and process digital words from ADCs 0-15, another can receive and process digital words from ADCs 1-16, another can receive and process digital words from ADCs 2-17, and so on.

Each DAFFE slice can further include multiple sets of the above-described LUTs to allow for parallel processing of smaller groups of the sixteen digital words. More specifically, in this embodiment, each DAFFE slice can receives sixteen 6-bit (6 b) digital words, which are sampled at successive unit intervals from sixteen of thirty-two ADCs and which correspond to the sampling of analog signals at sixteen different taps.

Each DAFFE slice can further include multiple sets of look-up tables (LUTs) in binary offset format and address generators for each set. Specifically, each DAFFE slice can include a lower order set of LUTs for lower order taps, a lower order address generator, a higher order set of LUTs for higher order taps and a higher order address generator.

The lower order set of LUTs can include four different LUTs in offset binary format including: a first DA LUT, a first adjustment LUT, a second DA LUT and a second adjustment LUT. The first DA LUT can store pre-calculated first possible outcomes for first sum of partial products computations. The first adjustment LUT can store first pre-calculated possible outcomes for first correction plus offset computations. The second DA LUT can store pre-calculated second possible outcomes for second sum of partial products computations. The second adjustment LUT can store pre-calculated second possible outcomes for second correction computations only.

The lower order address generator can generate LUT addresses for acquiring data from the lower order set of LUTs using the first eight of sixteen digital words received by the DAFFE slice. Specifically, the lower order address generator can generate five first DA LUT addresses from a group of least significant bits (LSBs) of a first group of four of the eight 6 b digital words through a group of next-to-most significant bits (next-to-MSBs) of the first group, respectively, and can further convert or map these addresses from standard binary to offset binary format in order to acquire five first sum of partial products values from the first DA LUT. The lower order address generator can generate a first adjustment LUT address from a group of MSBs of the first group and can further convert or map that address from standard binary to offset binary format in order to acquire a first adjustment value from the first adjustment LUT. The lower order address generator can also generate five second DA LUT addresses from a group of LSBs of a second group of four of the eight 6 b digital words through a group of next-to-MSBs of the second group, respectively, and can further convert or map these addresses from standard binary to offset binary format to acquire five second sum of partial products values from the second DA LUT. The lower order address generator can further generate a second adjustment LUT address from a group of MSBs of the second group and can convert or map that address from standard binary to offset binary format to acquire a second adjustment value from the second adjustment LUT.

The higher order set of LUTs can similarly include four different LUTs in offset binary format including: a third DA LUT, a third adjustment LUT, a fourth DA LUT and a fourth adjustment LUT. The third DA LUT can store pre-calculated third possible outcomes for third sum of partial products computations. The third adjustment LUT can store pre-calculated third possible outcomes for third correction plus offset computations. The fourth DA LUT can store pre-calculated fourth possible outcomes for fourth sum of partial products computations. The fourth adjustment LUT can store pre-calculated fourth possible outcomes for fourth correction computations only.

The higher order address generator can generate LUT addresses for acquiring data from the higher order set of LUTs using the next eight of the sixteen digital words received by the DAFFE slice. Specifically, the higher order address generator can generate five third DA LUT addresses from a group of least significant bits (LSBs) of a third group of four of the eight 6 b digital words through a group of next-to-most significant bits (next-to-MSBs) of the third group, respectively, and can further convert or map these addresses from standard binary to offset binary format in order to acquire five third sum of partial products values from the third DA LUT. The higher order address generator can further generate a third adjustment LUT address from a group of MSBs of the third group and can further convert or map that address from standard binary to offset binary format in order to acquire a third adjustment value from the third adjustment LUT. The higher order address generator can further generate five fourth DA LUT addresses from a group of LSBs of a fourth group of four of the eight 6 b digital words through a group of next-to-MSBs of the fourth group, respectively, and can further convert or map these addresses from standard binary to offset binary format to acquire five fourth sum of partial products values from the fourth DA LUT. The higher order address generator can further generate a fourth adjustment LUT address from a group of MSBs of the fourth group and can convert or map that address from standard binary to offset binary format to acquire a fourth adjustment value from the fourth adjustment LUT.

As mentioned above, in the present invention, the most significant bits (MSBs), which represent signal polarity only (i.e. not signal magnitude), are dropped when forming the DA LUT addresses used to acquire data from each of the above-mentioned DA LUTs. To compensate for a magnitude reduction in the final output, due to this dropping of the MSBs when generating the DA LUT addresses, the next-to-MSBs of any given group of digital words will specifically be modified to their inverted value before being combined to form the corresponding DA LUT address for the next-to-MSB position.

In any case, the DAFFE can further include downstream adder logic including, but not limited to, multiple adders, which in combination compute a total sum of the first sum of partial products values acquired from the first DA LUT, the first adjustment value acquired from the first adjustment LUT, the second sum of partial products values acquired from the second DA LUT, the second adjustment value acquired from the second adjustment LUT, the third sum of partial products values acquired from the third DA LUT, the third adjustment value acquired from the third adjustment LUT, the fourth sum of partial products values acquired from the fourth DA LUT, and, finally, the fourth adjustment value acquired from the fourth adjustment LUT to solve a DA equation.

It should be understood that the various adjustment values mentioned-above can incorporate both a correction component and an offset component in order to compensate for the reduction in size of the associated DA LUT due to dropping of the MSBs and the use of the offset binary format, respectively. Additionally, it should be noted that as a result of this DAFFE configuration and, particularly, the reduced number of sum of partial products values acquired from each DA LUT due to the dropping of the MSBs when generating the DA LUT addresses, there is a corresponding reduction in the downstream adder logic complexity required to solve the DA equation and, thereby a corresponding reduction in power consumption when processing the data from the DA LUTs.

Also disclosed herein are corresponding feed forward equalization methods employing such a power-optimized distributed arithmetic (DA) architecture.

The methods can provide a distributed arithmetic (DA) feed forward equalizer, as described in greater detail above, which is configured as described above for power optimization and which includes at least one a set of look-up tables (LUTs) in offset binary format. Specifically, the LUTs can include at least one DA LUT and an adjustment LUT for each DA LUT. Pre-calculated possible outcomes for sum of partial products computations can be stored within the DA LUT. Pre-calculated possible outcomes for correction plus offset computations can be stored within the adjustment LUT.

The methods can include receiving, at a retimer of the DAFFE, digital words each with an equal number of bits (e.g., N-bit words). The digital words can be received, for example, at successive unit intervals from multiple analog-to-digital converters (ADCs).

The method can further include forwarding, by the retimer to an address generator of the DAFFE, a predetermined number of the digital words. That is, as the digital words are received, they can be captured and held. When a predetermined number of those words have been captured and held, they can be forwarded by the retimer to the address generator for further processing.

The method can further include using, by an address generator of the DAFFE, the predetermined number of received digital words to generate LUT address in the standard binary format. The addresses can include both DA LUT addresses for acquiring sum of partial products values from the DA LUT and an adjustment LUT address for acquiring an adjustment value from the adjustment LUT.

The DA LUT addresses can be generated by the address generator from a group of least significant bits (LSBs) of the predetermined number of digital words through a group of next-to-most significant bits (next-to-MSBs) of those same digital words, respectively. Specifically, a group of bits made up of the LSBs of a set number of digital words are combined by the address generator to form one DA LUT address, a group of bits made up of the next-to-LSBs of the same digital words are combined by the address generator to form another DA LUT address, and so on until a group of bits made up of the next-to-MSBs of the same digital words are modified and combined by the address generator to form the last DA LUT address associated with that set number of digital words. As mentioned above, in the present invention, the most significant bits (MSBs), which represent signal polarity alone (i.e., not magnitude), are dropped when forming DA LUT addresses. To compensate for a magnitude reduction in the final output, due to this dropping of the MSBs when generating the DA LUT addresses, the next-to-MSBs are specifically modified to their inverted value before being combined to form the corresponding DA LUT address for the next-to-MSB position.

The adjustment LUT address can be generated by the address generator from a group of bits made up of the most significant bits (MSBs) of the same digital words used to form the DA LUT addresses, discussed above. That is, a group of bits made up of the MSBs of the same digital words can be combined by the address generator to form an adjustment LUT address.

The method can further include processing of the above-mentioned LUT addresses, which are in standard binary format, by the address generator for use in acquiring data from the LUTs, which are in offset binary format. Specifically, standard binary DA LUT addresses can be converted or mapped by the address generator to offset binary LUT addresses and then forwarded to the appropriate LUT for processing. The offset binary DA LUT addresses can be received, as inputs, by the DA LUT from the address generator and, in response, the DA LUT can output the sum of partial products values that were stored at the addressed locations. Similarly, the standard binary adjustment LUT address can be converted or mapped by the address generator to an offset binary adjustment LUT address. The offset binary adjustment LUT address can be received, as an input, by the adjustment LUT from the address generator and, in response, the adjustment LUT can output an adjustment value that was stored at the addressed location.

The methods can further include receiving, by at least one adder, the sum of the partial products values acquired from the DA LUT and the adjustment value acquired from the adjustment LUT. The method can further include computing, by the adder(s), the total sum of the sum of partial products values and the adjustment value in order to solve a DA equation.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
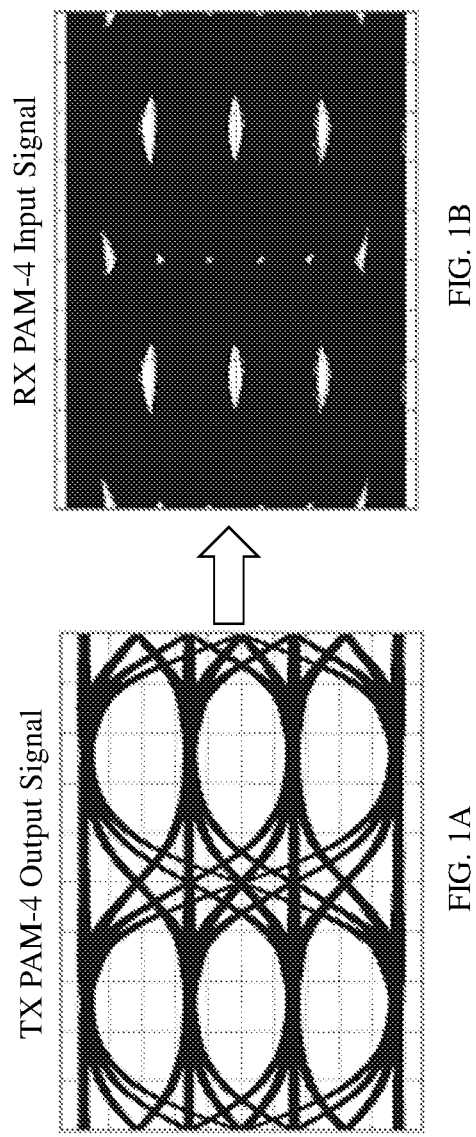
FIGS. 1A-1B are diagrams illustrating exemplary PAM-4 signals upon being transmitted by a transmitter (TX) and upon being received by a receiver (RX), respectively.
Figure 2:
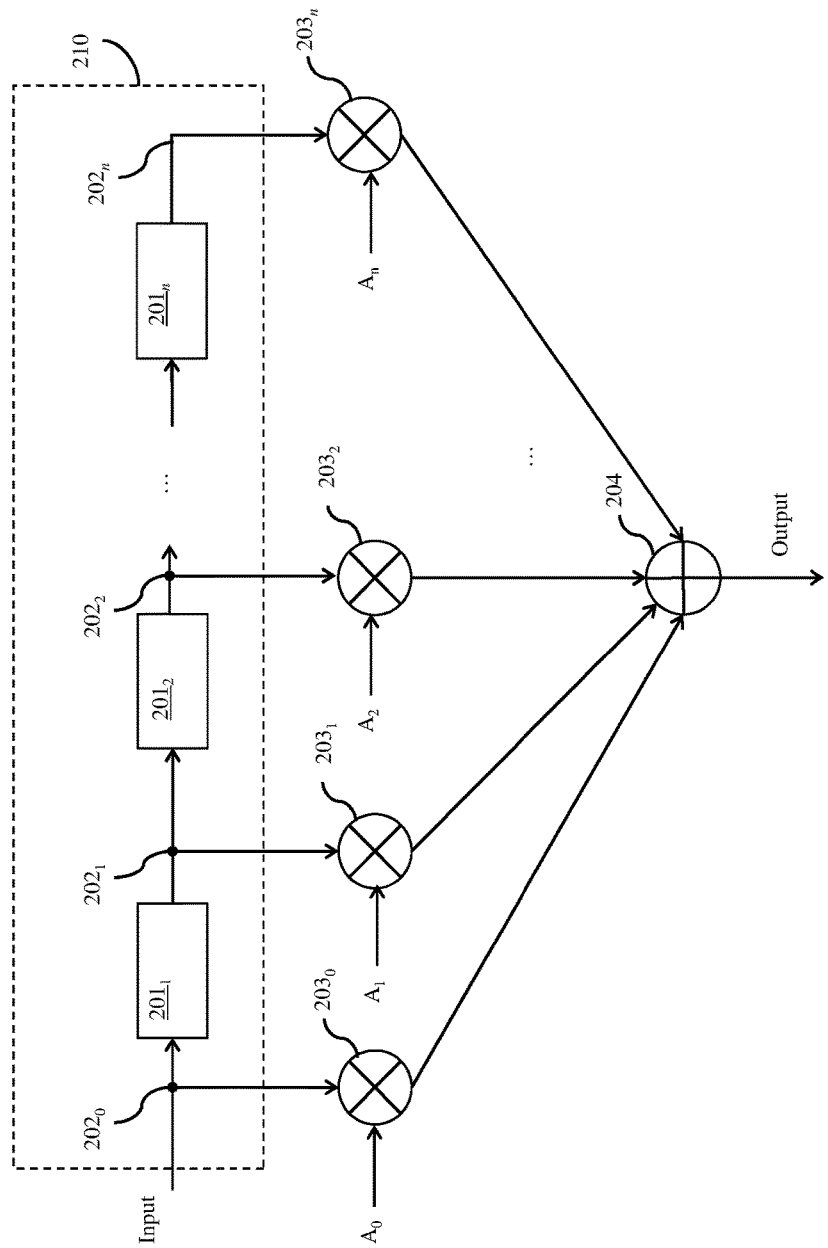
FIG. 2 is a schematic diagram illustrating an exemplary analog feed forward equalizer.

As mentioned above, while currently available distributed arithmetic feed forward equalizer (FFE) architectures are suitable for performing the required equalization process in receivers, improvements and/or modifications that enable device size scaling, power optimization and faster operating speeds are generally desirable. For example, recent improvements to the basic DAFFE architecture have included: LUT partitioning to reduce memory size and, thereby the memory access time; use of the offset binary format for LUTs as opposed to the standard, two's complement, binary format; and use of parallel processing as opposed to serial processing of digital inputs for faster outputs. Still, with continued advances in technology and consumer reliance on portable battery-operated devices, it would be advantageous to provide additional improvements and/or modifications particularly to reduced power consumption.

In view of the foregoing, disclosed herein are embodiments of a feed forward equalizer (FFE) with a power-optimized distributed arithmetic (DA) architecture and a corresponding equalization method. The disclosed DAFFE, like a conventional DAFFE, includes at least one DA look-up table (LUT), which is in offset binary format and which stores pre-calculated possible outcomes for sum of partial products computations for a given bit position across taps within a DA equation. Those skilled in the art will recognize that the use of the offset binary format for a DA LUT allows the size of that DA LUT to be reduced by half due to the properties of symmetry and inversion in the offset binary format (as discussed in greater detail below). Unlike a conventional DAFFE, which is accessed using DA LUT addresses formed from groups of same-position bits of all the bits in a set of digital words from a set of taps. The DA LUT of the DAFEE disclosed herein can be accessed using a lesser number of DA LUT addresses, which formed from groups of same-position bits from all but the most significant bits (MSBs) of the set of digital words of taps. As a result, the size of the DA LUT is further reduced. The disclosed DAFFE can also include an adjustment LUT for each DA LUT. The adjustment LUT can store pre-calculated adjustment values and can be accessed using an adjustment LUT address, which is formed using the MSBs from the same set of digital words. The disclosed DA FEE can also include adder(s) that compute the total sum of sum of partial products values acquired from the DA LUT using the DA LUT addresses and the adjustment value acquired from the adjustment LUT using the adjustment LUT address in order to correctly solve a DA equation. As discussed in greater detail below, the adjustment value is included in the DA equation and incorporates both a correction component and an offset component to compensate for dropping the MSBs when forming DA LUT addresses (i.e., the reduced number of sum of partial products values acquired) and the use of the offset binary format. As a result of this DAFFE configuration and, particularly, the reduced number of sum of partial products values acquired from the DA LUT(s) due to the dropping of the MSBs when generating the DA LUT addresses, there is a corresponding reduction in the downstream adder logic complexity required to solve the DA equation and, thereby a corresponding reduction in power consumption when processing the data from the DA LUT.

Figure 3:
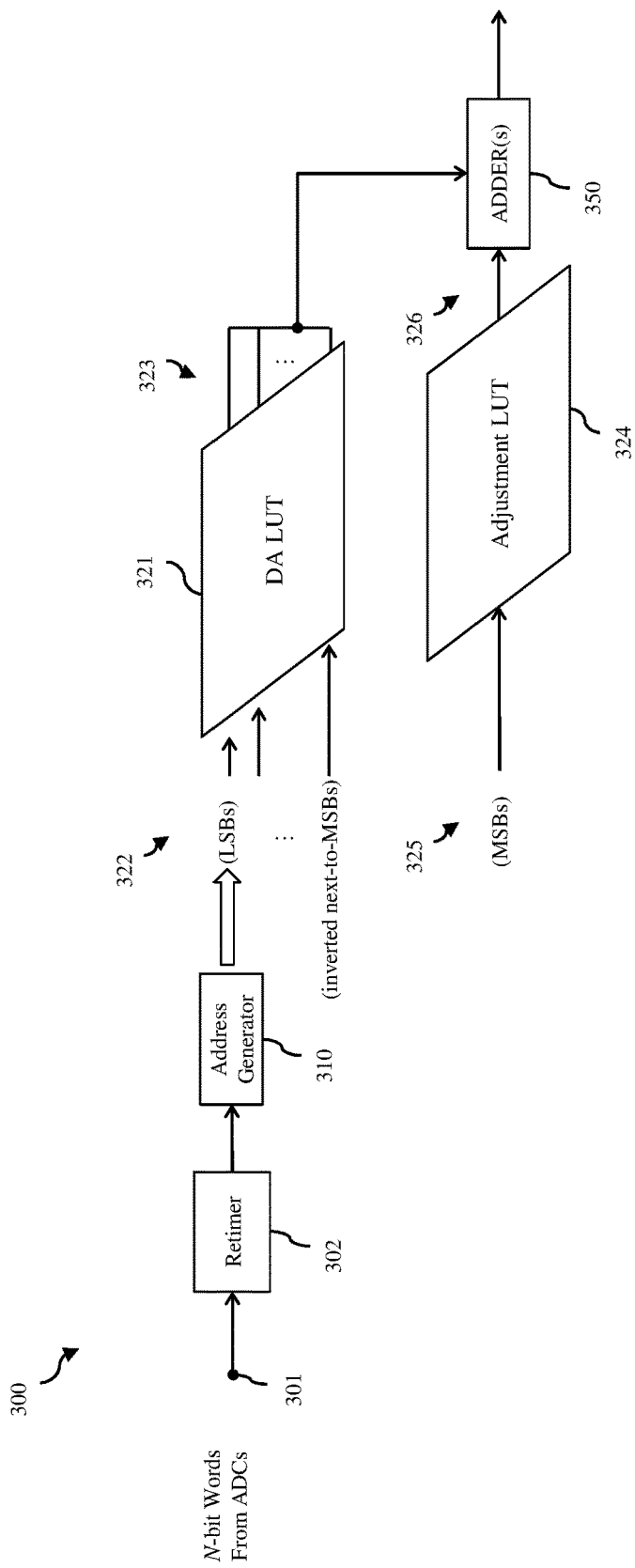
FIG. 3 is a diagram illustrating an embodiment of a digital feed forward equalizer with a power-optimized distributed arithmetic (DA) architecture.

More particularly, referring to FIG. 3, disclosed herein are embodiments of a feed forward equalizer (FFE) 300 with a power-optimized distributed arithmetic (DA) architecture. Such a DAFFE 300 can be incorporated into a receiver (RX), such as a level-4 pulse amplitude modulation (PAM-4) data receiver, to correct for signal degradation. Specifically, the RX can include an Analog Front End (AFE), which receives an analog signal transmitted from a transmitter (TX) and which can include, but is not limited to, an amplifier and a Continuous Time Linear Equalizer (CTLE) that initially processes the received signal. The RX can further include analog-to-digital converters (ADCs), which convert the received signal from analog to digital, and output digital words in standard binary format to the DAFFE 300. These digital words can have an equal number of bits. That is, they can all be N-bit digital words.

The DAFFE 300 can include a retimer 302 with an input 301, which receives the digital inputs (i.e., the N-bit digital words) from the ADCs at successive unit intervals (UI). The retimer 302 can capture and hold the digital words until some predetermined number of the digital words are sampled (i.e., held). Once the predetermined number of digital words have been captured and held, the retimer 302 can forward them as a group for parallel feed forward equalization processing.

The DAFFE 300 can further include at least one set of look-up tables (LUTs) that store data in offset binary format. Those skilled in the art will recognize that in the standard binary format signal data is represented by a digital word containing bits of 0's and 1's with the most significant bit (MSB) in the digital word indicating signal polarity and the remaining bits (i.e., the least significant bit (LSB) to the next-to-MSB) indicating magnitude. For example, a 0 MSB can represent positive signal polarity and a 1 MSB can represent negative signal polarity. Offset binary format instead refers to a digital coding scheme where all-zero corresponds to the minimal negative value and all-one to the maximal positive value. For example, the 4-bit (4 b) address of a LUT in standard binary format would range from 1000, the most negative value of −8 to 0111, the most positive value of +7 which is a range of 16 values. A first 4-bit address in standard binary format would be 0000 and in offset binary it would be offset upward by half the range, yielding 1000. 1000 is 0000+8, where 8 is half the full range of 16.

The set of LUTs can include at least one distributed arithmetic (DA) LUT 321 and at least one adjustment LUT 324 for each DA LUT 321. The DA LUT 321 can store the pre-calculated results (i.e., possible outcomes) of a DA equation's sum of partial products (i.e., pre-calculated sum of partial products values) for a bit position across taps with their respective filter coefficients. In binary offset format, this DA LUT table is symmetric such that the top half of the table is a reflection of the bottom half of the table about the center. This helps in reducing the LUT size by half with the understanding of symmetry in the downstream processing logic. The corresponding adjustment LUT 324 can store pre-calculated possible outcomes for correction plus offset computations (i.e., pre-calculated adjustment values) also within this DA equation (also as discussed in greater detail below).

More specifically, those skilled in the art will recognize that a DAFFE is typically configured to solve the following basic DA equation:

$$Y_k = \Sigma_{n=r}^{s} A_n \times D_{k-n}, \tag{1}$$

where $Y_k$ are the digital outputs of the DAFFE, where n is the number of taps, where k is a unit of time, where $D_k$ are the digital words received from the ADCs, and where $A_n$ are the corresponding filter coefficients (also referred herein as tap weights or tap coefficients) for each some specific number n of taps ranging from tap r to tap s. All possible sum of partial products values, which are pre-calculated and stored in the DA LUT, are derived from the sum of products of a given position's value of $D_{k-n}$ across a range of n values with their respective $A_n$ values, for this DA equation. The number of entries in the DA LUT will be a function of the number n of taps used to form DA LUT addresses for acquiring sum of partial products values across those n taps, respectively. For example, for a group of X, N-bit digital words, a total of $2^X$ DA LUT addresses would typically be generated. The first DA LUT address would be formed from all of the least-significant-bits (LSBs) of the X digital words, the second DA LUT address would be formed from all of the next-to-LSBs of the X digital words, and so on through the last DA LUT address, which would be formed from all of the most-significant-bits (MSBs) of the X digital words. Thus, the DA LUT would contain $2^X$ stored values to solve the basic DA equation (1). It should be noted that s-r taps may be divided into (s-r)/X groups for best performance, power and ease of implementation.

If the DA LUT is, instead, in offset binary format, the size of that DA LUT (i.e., the number of stored sum of partial products values) can be reduced by half (i.e., to $2^{X-1}$). This is because conversion from the standard binary to the offset binary results in the top and bottom halves of the DA LUT being symmetric except for the signs of the stored content (i.e., except for stored value polarity). That is, the bottom half of the DA LUT will be the sign-reversed mirror image of the top half. For example, when a DA LUT with sixteen stored values in rows 0-15 is converted from the standard binary to the offset binary format, rows 0-7 will be symmetric to rows 8-15 except for the signs of the stored content (i.e., except for stored value polarity) so that rows 7 and 8 store the same absolute values with different polarities, the rows 6 and 9 store the same absolute values with different polarities, etc. Thus, the bottom half can be eliminated form the DA LUT.

To account for the reduced LUT size (i.e., to account for the compressed range of sum of partial products values stored in an offset binary DA LUT), prior art DAFFEs have been configured to implement the following modified DA equation that adds a constant offset value to the sum of the partial products:

$$Y_k = \sum_{n=r}^{s} Q_{k,j} \times 2^j + Q_{offset}, \tag{2}$$

where $Q_{k,j}$ represent the partial products values acquired from the DA LUT and where $Q_{offset}$ represents a constant offset value that is equal to $$\left( \sum_{n=r}^{s} -\frac{1}{2} \times A_n \right)$$

and that is added to the sum of the partial products values. $Q_{offset}$ effectively shifts the output of the DAFFE to the correct value and is typically accomplished using a register that feeds the offset value into an adder within the binary offset DAFFE architecture, thereby ensuring that the modified DA equation is solved correctly.

In the DAFFE 300 disclosed the addressing logic related to the MSB bits and the complexity of the downstream adders 350 (discussed in greater detail below) is reduced in accordance with the removed MSB bits in the blocks 310, 322 and 321. Additionally, the next-to-MSBs are modified to their inverted value in lieu of the magnitude reduction from the dropping of MSBs. All other bit values (e.g., the least-significant-bits (LSBs), the next-to-LSBs, etc.) remain unchanged when generating corresponding DA LUT addresses. In any case, to account for the reduced size of these blocks, the disclosed DAFFE 300 is configured to implement the DA equation rewritten as follows:

$$Y_k = \sum_{n=r}^{s} Q_{k,j} \times 2^j + Q_{offset} + Q_{correction}, \tag{3}$$

where $Q_{correction}$ represents a variable correction value that is equal to $$\left(\frac{1}{2}\sum_{n=r}^{s}(\pm 1)\times A_n + 2^N\right)$$

and that accounts for signal polarity (given that the sum of partial products value that would otherwise account for signal polarity was not acquired from the DA LUT 321). Thus, in the present invention, the combination of $Q_{offset}$ and $Q_{correction}$ effectively shifts the output of the DAFFE 300 to the correct level. However, since the value of $Q_{correction}$ is variable, it cannot be applied using a register alone. Thus, as mentioned above, the disclosed DAFFE 300 includes, for each DA LUT 321, a corresponding adjustment LUT 324 (as opposed to just an offset register). This adjustment LUT 324 stores pre-calculated possible outcomes for correction plus offset computations (i.e., for $Q_{offset}$ and $Q_{correction}$) (i.e., pre-calculated adjustment values that include both a correction component and an offset component).

The disclosed DAFFE 300 can further include an address generator 310 (also referred to herein as an address generation logic block), which receives a group of digital words from the retimer 302 (e.g., the X, N-bit digital words) and generates LUT addresses for acquiring sum of partial products values from the DA LUT 321 and an adjustment value from the adjustment LUT 324. The retimer 302 can include first-in-first-out (FIFO) logic for generating the various tap signals of the FIR, which are unit-time delayed versions of the input digital data. The address generator 310 can generate the look-up table (LUT) addresses (including DA LUT addresses and an adjustment LUT address) in standard binary format and can include additional logic for processing these standard binary LUT addresses for use with the LUTs, which are in offset binary format. That is, the address generator 310 can include address processing logic configured to convert these LUT addresses from standard binary to offset binary format or, alternatively, mapping logic for mapping the addresses to a corresponding offset binary address (given top and bottom half LUT symmetry discussed above).

More specifically, for a received group of digital words corresponding to a group of specific signal taps, the address generator can generate DA LUT addresses from a group of the least significant bits (LSBs) of the digital words through a group of next-to-most significant bits (next-to-MSBs) of the digital words, respectively. That is, when the predetermined number (X) of digital words from the FIFO chain is forwarded to the address generator 310, they can be decomposed by the address generator 310. A group of bits made up of the LSBs of the digital words is combined to form one X-bit DA LUT address, a group of bits made up of the next-to-LSBs of the same digital words is combined to form another X-bit DA LUT address, and so on until a group of bits made up of the next-to-MSBs of the same digital words is modified and then combined to form the last X-bit DA LUT address associated with that X digital words. To compensate for a magnitude reduction in the final output, due to this dropping of the MSBs when generating the DA LUT addresses, the next-to-MSBs are specifically modified to their inverted value before being combined to form the corresponding DA LUT address for the next-to-MSB position. All other bit values (i.e., the LSBs, the next-to-LSBs, etc.) remain unchanged when generating corresponding DA LUT addresses.

The address generator 310 can further process these standard binary X-bit DA LUT addresses so that they can be used with the DA LUT 321, which is in the offset binary format. That is, the address generator 310 can convert or map these address to offset binary X-bit DA LUT addresses 322 and can output them to the DA LUT 321 for processing. The DA LUT 321 can receive the offset binary X-bit DA LUT addresses 322 as discrete inputs and can, in response, output sum of partial products values 323 stored in the addressed locations.

As mentioned above, the most significant bits (MSBs), which represent signal polarity, are dropped when generating DA LUT addresses. However they are still used. Specifically, the address generator 310 can form an X-bit adjustment LUT address from a group of bits made up of the most significant bits (MSBs) of the same digital words that were used to form the X-bit DA LUT addresses, discussed above. The address generator 310 can further processes this standard binary X-bit adjustment LUT address so that it can be used with the adjustment LUT 324, which is in offset binary format. That is, the address generator 310 can convert or map this address to an offset binary X-bit adjustment LUT address 325 and can output it to the adjustment LUT 324 for processing. The adjustment LUT 324 can receive the offset binary X-bit adjustment LUT address 325 as an input and can, in response, output an adjustment value 326 stored at the addressed location.

The disclosed DAFFE 300 can further include downstream adder logic including, but not limited to, at least one adder 350 that can add together the sum of partial products values 323 acquired from the DA LUT 321 and the adjustment value 326 acquired from the adjustment LUT 324 in order to correctly solve the DA equation (3).

It should be noted that the adjustment value is included in the DA equation (3) and incorporates both the correction component and the offset component in order to compensate for the reduction in size of the DA LUT due to the dropping of the MSBs and the use of the offset binary format, respectively. Additionally, it should be noted that this DAFFE configuration and, particularly, the reduced number of sum of partial products values acquired from the DA LUT due to the dropping of the MSBs when generating the DA LUT addresses, allows for a corresponding reduction in the complexity of the downstream adder logic (e.g., adder(s) 350) and, thereby a corresponding reduction in power consumption when processing the data from the DA LUT.

Embodiments of the disclosed DAFFE can include multiple DAFFE slices (as described above) that operate in parallel to process different groups of digital inputs (e.g., from substantially over lapping sub-sets of analog-to-digital converters (ADCs) within a larger set of ADCs). Additionally, embodiments of the DAFFE can include multiple sets of the above-described LUTs in a single DAFFE slice to allow for parallel processing of relatively small groups of digital inputs, which have been sampled from a given sub-set of the larger set of ADCs.

To better illustrate the features of the disclosed DAFFEs with power-optimized distributed arithmetic (DA) architecture, one particular embodiment (namely DAFFE 400) is described in greater detail below and illustrated in FIG. 4.

Figure 4:
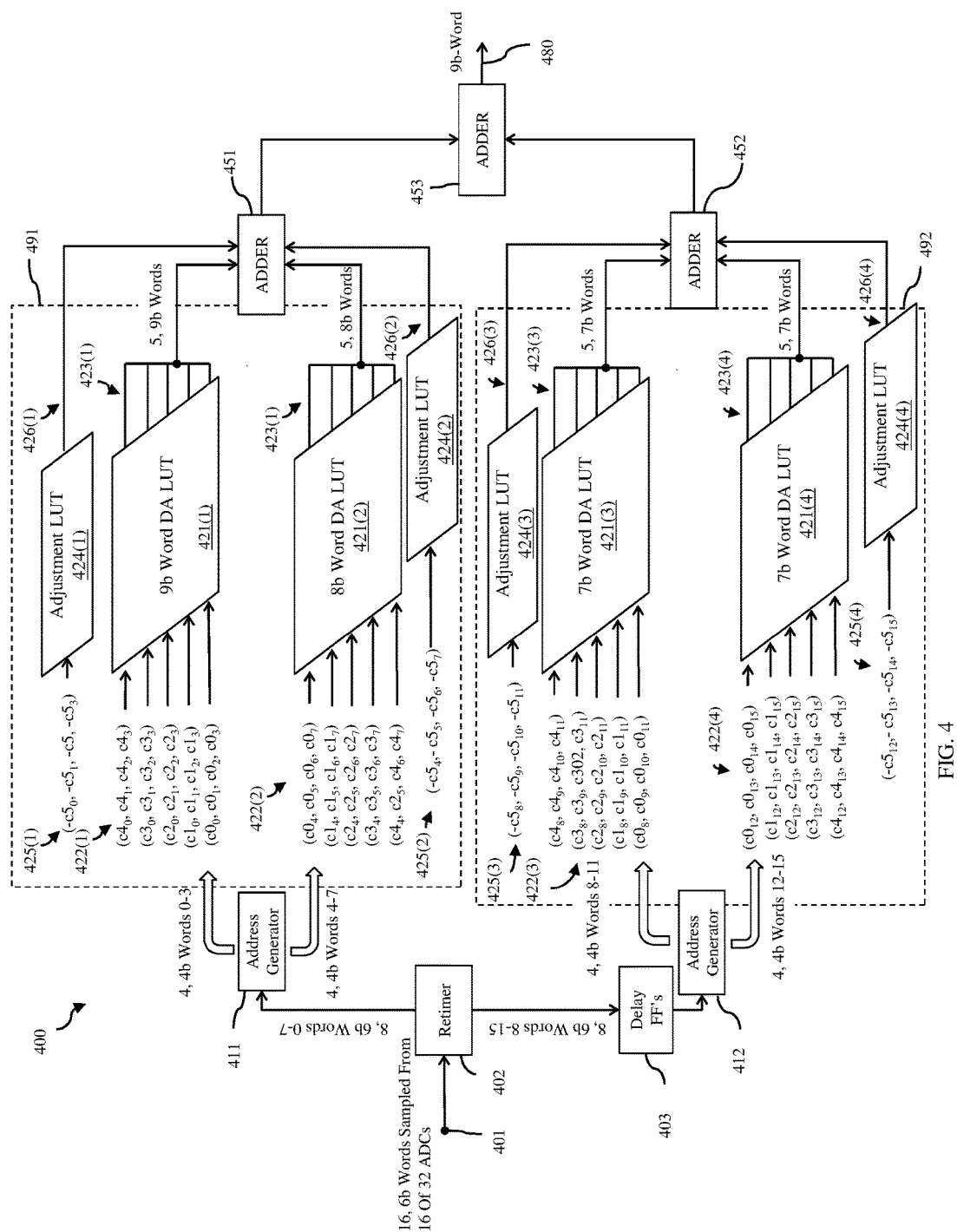
FIG. 4 is a diagram illustrating another embodiment of a digital feed forward equalizer with a power-optimized distributed arithmetic (DA) architecture.

The DAFFE 400 can include sixteen, essentially identical, DAFFE slices, one of which is shown in FIG. 4. These slices can operate in parallel to process sixteen different groups of digital words from sixteen substantially overlapping sub-sets of analog-to-digital converters (ADCs) within a larger set of thirty-two ADCs 0-32 that process an analog signal (e.g., a 56 Gbps PAM-4 signal) after it has been received by a receiver (RX) from a transmitter (TX) and processed by an analog front end (AFE) of the RX.

In the DAFFE 400 one slice can receive and process digital words from ADCs 0-15, another can receive and process digital words from ADCs 1-16, another can receive and process digital words from ADCs 2-17, and so on.

Each of the DAFFE slices will solve the DA equation:

$$Y_k = \sum_{n=-3}^{12} A_n \times D_{k-n}, \quad (4)$$

where $Y_k$ are the digital outputs of the FFE corresponding to one group of digital word inputs, k is a unit time, n is the number of taps (e.g., 16), $D_k$ are the digital words received from the ADCs, and $A_n$ are the corresponding filter coefficients (also referred herein as tap weights) for each of the sixteen taps −3 to 12. In this equation (4), $D_k$ can be represented as follows:

$$D_k = \left(-d_{k,5} \times 2^5 + \sum_{n=0}^{4} d_{k,n} \times 2^n\right) \text{ or} \quad (5)$$

$$D_k = \sum_{n=0}^{5} b_{k,n} \times 2^n \quad (6)$$

where $b_{k,5} = -d_{k,5}$ for the MSB and $b_{k,n} = d_{k,n}$ for all other bits of the data sample $D_k$. Thus, equation (4) can be rewritten as follows:

$$Y_k = \sum_{n=-3}^{12}\left(\sum_{j=0}^{5} b_{(k-(n,j))} \times A^n\right) \times 2^j. \quad (7)$$

Furthermore, as discussed above, when using the offset binary format (as opposed to the standard binary format) the DA LUT size can be reduced. In this case, $D_k$ can further be rewritten as follows:

$$D_k = \frac{1}{2}\langle D_k - (-D_k)\rangle, \quad (8)$$

In two's complement, $-D_k$ can equate to the following:

$$-D_k = 1 + \sum_{n=0}^{5} \overline{b}_{k,n} \times 2^n. \quad (9)$$

Thus, the DA equation can further be rewritten as follows:

$$Y_k = \sum_{j=0}^{5}\left(\sum_{n=-3}^{12} \frac{1}{2} \times A_n \times c_{(k-(n,j))}\right) \times 2^j + \left(\sum_{n=-3}^{12} -\frac{1}{2} \times A_n\right) \quad (10)$$

where $$\sum_{j=0}^{5}\left(\sum_{n=-3}^{12} \frac{1}{2} \times A_n \times c_{(k-(n,j))}\right)$$

corresponds to a sum of products computation representative of a first half of the possible outcomes for the sum of partial products values (which are the sign-reversed mirror image of the bottom half, where $c_{k,n}$ represents $c_{k,n} = [b_{k,n} - \overline{b}_{k,n}]$, where, for n=0 to 5, $c_{k,n}$ takes $\{-1,1\}$ values because $b_{k,n}$ is $\{0,1\}$, and where $$\left(\sum_{n=-3}^{12} -\frac{1}{2} \times A_n\right)$$

represents a constant offset value (also referred to herein as $Q_{offset}$).

Additionally, as mentioned above, the MSBs of each of the digital words received by the DAFFE 400 will indicate signal polarity (whereas the LSBs through the next-to-MSBs indicate magnitude) and in the embodiments disclosed herein the DAFFE is configured to drop these MSB when generating addresses for DA LUT(s) resulting in smaller size of the DA LUT(s) and further resulting in corresponding reductions in the number of sum of partial products values acquired from the DA LUT(s), the downstream adder logic complexity required to process those sum of partial products values and power consumption (e.g., by up to 5%) during operation. In order to compensate for this reduction in sum of partial products values and shift the output of the DAFFE 400 to the correct level, the DA equation solved by the DAFFE 400 can further be rewritten as follows:

$$Y_k = \sum_{j=0}^{4}\left(\sum_{n=-3}^{12} \frac{1}{2} \times A_n \times c_{(k-(n,j))}\right) \times 2^j + \left(\sum_{n=-3}^{12} -\frac{1}{2} \times A_n\right) + \left(\frac{1}{2} \times \sum_{n=-3}^{12} (\pm 1) \times A_n \times 32\right), \quad (11)$$

where $$\sum_{j=0}^{4}\left(\sum_{n=-3}^{12} \frac{1}{2} \times A_n \times c_{(k-(n,j))}\right)$$

corresponds to the sum of products of tap data $c_{(k-(n,j))}$ with tap coefficients $A_n$, where $c_{(k-(n,j))}$ for j=4 is inverted to account for magnitude reduction from the dropping of MSB, where $$\left(\sum_{n=-3}^{12} -\frac{1}{2} \times A_n\right)$$

represents the constant offset value ($Q_{offset}$) included to account for using the offset binary format, where $$\left(\frac{1}{2} \times \sum_{n=-3}^{12} (\pm 1) \times A_n \times 32\right)$$

represents a variable correction value (also referred to herein as $Q_{correction}$) included to account for the dropping of the MSBs for the DA LUT addresses, and where $$\left(\sum_{n=-3}^{12} -\frac{1}{2} \times A_n\right) + \left(\frac{1}{2} \times \sum_{n=-3}^{12} (\pm 1) \times A_n \times 32\right)$$

corresponds to correction plus offset computations to ensure that the final output of the DA equation and, thereby the DA FEE is correct.

Figure 5:
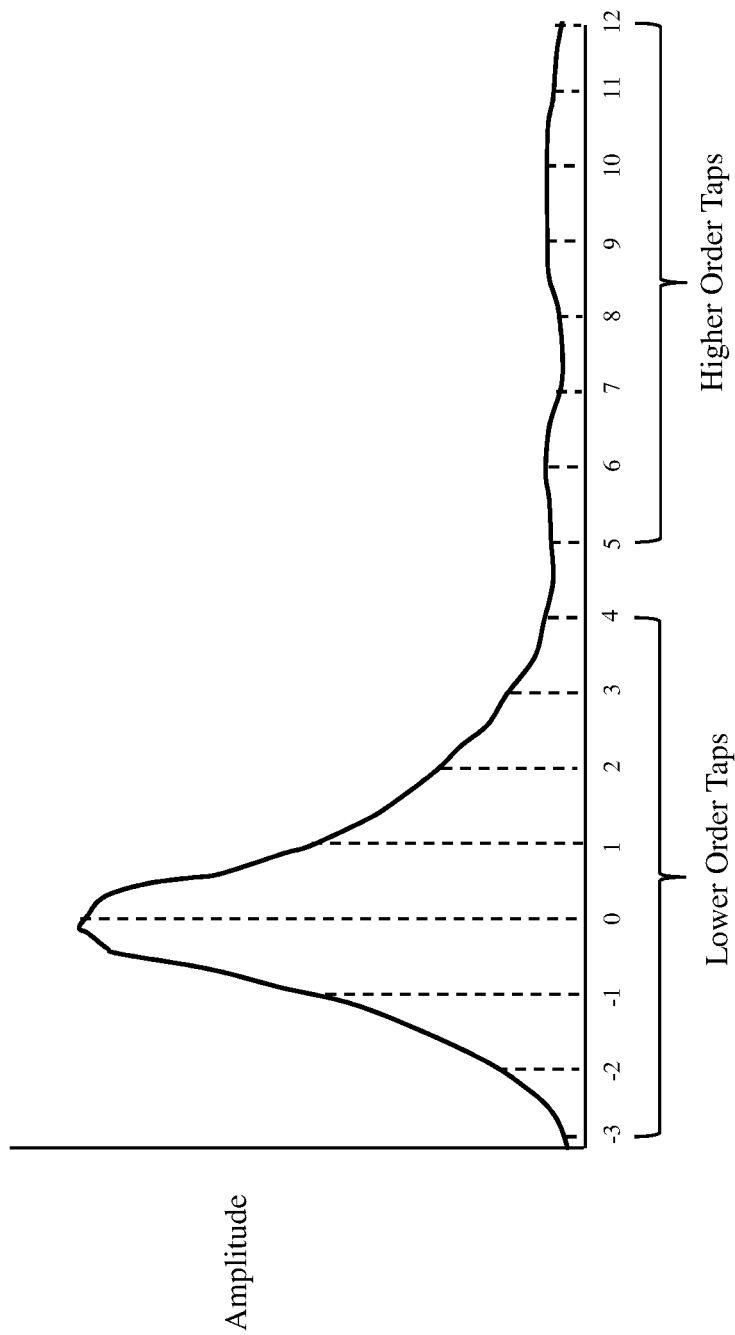
FIG. 5 is a graph illustrating taps on an exemplary impulse response.

To solve this DA equation (11), each DAFFE slice in the DAFFE 400 can further include multiple sets of DA and adjustment LUTs (as described above with regard to FIG. 3) to allow for parallel processing of smaller groups of the sixteen 6 b digital words received from the sixteen ADCs. Additionally, each DAFFE slice can include a retimer 402 with an input 401 that receives sixteen 6-bit (6 b) digital words at successive unit intervals of, for example, 16.6 picoseconds (ps). These digital words can be received from sixteen of thirty-two different ADCs and can correspond to the sampling of analog signals at sixteen different taps (e.g., see taps −3 to 12 on the exemplary impulse response shown in FIG. 5).

Each DAFFE slice can further include multiple sets 491-492 of look-up tables (LUTs) in binary offset format and address generators 411-412 for each set. Specifically, each DAFFE slice can include a lower order set 491 of LUTs for eight lower order taps (e.g., taps −3 to 4 shown in FIG. 5), a lower order address generator 411, a higher order set 492 of LUTs for higher order taps (e.g., see taps 5-12 of FIG. 5) and a higher order address generator 412.

In operation, the retimer 402 can receive the 6 b digital words can capture and hold the received digital words until the first eight 6 b digital words are received. The retimer 402 can then forward the first eight to the lower order address generator 411 for parallel feed forward equalization processing. Meanwhile, the retimer 402 can continue to hold the newly received 6 b digital words until the next eight are received. The retimer 402 can then forward the next eight to the higher order address generator 412 (e.g., via delay flip flops 403) for parallel feed forward equalization processing.

The lower order set of LUTs 491 can include four different LUTs in offset binary format. These LUTs can include a first DA LUT 421(1), a first adjustment LUT 424(1), a second DA LUT 421(2) and a second adjustment LUT 424(2). The first DA LUT 421(1) can store pre-calculated first possible outcomes for first sum of partial products computations associated with the four lowest taps (i.e., taps −3 to 0). The first adjustment LUT 424(1) can store pre-calculated first possible outcomes for first correction plus offset computations also associated with these four taps −3 to 0. The second DA LUT 421(2) can store pre-calculated second possible outcomes for second sum of partial products computations associated with the next four lowest taps (i.e., taps 1 to 4). The second adjustment LUT 424(2) can store second possible outcomes for second correction plus offset computations only associated with these same four taps 0 to 4.

The lower order address generator 411 can generate LUT addresses for acquiring data from the lower order set 491 of LUTs using the first eight of sixteen digital words received by the DAFFE slice and forwarded to the lower order address generator 411 from the retimer 402. Specifically, the lower order address generator 411 can first divide the received digital words into two groups of four 6 b digital words. The lower order address generator 411 can then generate five first DA LUT addresses, in standard binary format, by decomposing four 6 b digital words in the first group and using the corresponding bits from those words (except for the most-significant-bits (MSBs)) to form five, standard binary, first DA LUT addresses, each having 4 bits. That is, the lower order address generator 411 can generate the five, standard binary, 4 b first DA LUT addresses from a group of least significant bits (LSBs) of the first group through a group of next-to-most significant bits (next-to-MSBs) of the first group, respectively. The lower order address generator 411 can further process these five, standard binary, 4 b first DA LUT addresses (e.g., convert or map them to five, offset binary, 4 b first DA LUT addresses 422(1), respectively) in order to acquire (i.e., access) five first sum of partial products values 423(1) stored in the first DA LUT 421(1) at the addressed locations.

The lower order address generator 411 can also generate a standard binary, 4 b first adjustment address from a group of MSBs of the first group and can process that standard binary, 4 b first adjustment address (e.g., convert or map it into an offset binary, 4 b first adjustment address 425(1)) in order to acquire a first adjustment value 426(1) stored in the first adjustment LUT 424(1) at the addressed location.

The lower order address generator 411 can also generate five second DA LUT addresses, in standard binary format, by decomposing the four 6 b digital words in the second group and using the corresponding bits from those words (except for the most-significant-bits (MSBs)) to form five, standard binary, second DA LUT addresses, each having 4 bits. That is, the lower order address generator 411 can generate the five, standard binary, 4 b second DA LUT addresses from a group of least significant bits (LSBs) of the second group through a group of next-to-most significant bits (next-to-MSBs) of the second group, respectively. The lower order address generator 411 can further process these five, standard binary, 4 b second DA LUT addresses (e.g., convert or map them to five, offset binary, 4 b second DA LUT addresses 422(2), respectively) in order to acquire (i.e., access) five second sum of partial products values 423(2) stored in the second DA LUT 421(2) at the addressed locations. The lower order address generator 411 can also generate a standard binary, 4 b second adjustment address from a group of MSBs of the second group and can process that standard binary, 4 b second adjustment address (e.g., convert or map it to an offset binary, 4 b second adjustment address 425(2)) in order to acquire a second adjustment value 426(2) stored in the second adjustment LUT 424(2) at the addressed location.

The higher order set of LUTs 492 can similarly include four different LUTs in offset binary format. These LUTs can include third DA LUT 421(3), a third adjustment LUT 424(3), a fourth DA LUT 421(4) and a fourth adjustment LUT 424(4). The third DA LUT 421(3) can store pre-calculated third possible outcomes for sum of partial products computations associated with the next four higher taps (i.e., taps 5 to 8). The third adjustment LUT 424(3) can store pre-calculated third possible outcomes for third correction plus offset computations associated with these same four taps 5 to 8. The fourth DA LUT 421(4) can store pre-calculated fourth possible outcomes for fourth sum of partial products computations associated with the four highest taps (i.e., taps 9-12). The fourth adjustment LUT 424(4) can store fourth possible outcomes for fourth correction computations only associated with these same four taps 9-12.

The higher order address generator 412 can generate addresses for acquiring data from the higher order set 492 of LUTs using the next eight of sixteen digital words received by the DAFFE slice and forwarded to the higher order address generator 412 by from the retimer 402 via the delay flip flops 403. Specifically, the higher order address generator 412 can divide the eight 6 b digital words into two groups (i.e., a third group and a fourth group).

The higher order address generator 412 can then generate five third DA LUT addresses, in standard binary format, by decomposing the four 6 b digital words in the third group and using the corresponding bits from those words (except for the most-significant-bits (MSBs) to form five, standard binary, third DA LUT addresses, each having 4 bits. That is, the higher order address generator 412 can generate the five, standard binary, 4 b third DA LUT addresses from a group of least significant bits (LSBs) of the third group through a group of next-to-most significant bits (next-to-MSBs) of the third group, respectively. The higher order address generator 412 can further process these five, standard binary, 4 b third DA LUT addresses (e.g., convert or map them to five, offset binary, 4 b third DA LUT addresses 422(3), respectively) in order to acquire (i.e., access) five third sum of partial products values 423(3) stored in the third DA LUT 421(3) at the addressed locations.

The higher order address generator 412 can also generate a standard binary, 4 b third adjustment address from a group of MSBs of the third group and can process that standard binary, 4 b third adjustment address (e.g., convert or map it to an offset binary, 4 b third adjustment address 425(3)) in order to acquire a third adjustment value 426(3) stored in the third adjustment LUT 424(3) at the addressed location.

The higher order address generator 412 can also generate five fourth DA LUT addresses, in standard binary format, by decomposing the four 6 b words digital words in the fourth group and using the corresponding bits from those words (except for the most-significant-bits (MSBs) into five, standard binary, fourth DA LUT addresses, each having 4 bits. That is, the higher order address generator 412 can generate the five, standard binary, 4 b fourth DA LUT addresses from a group of least significant bits (LSBs) of the fourth group through a group of next-to-most significant bits (next-to-MSBs) of the fourth group, respectively. The higher order address generator 412 can further process these five, standard binary, 4 b fourth DA LUT addresses (e.g., convert or map them to five, offset binary, 4 b fourth DA LUT addresses 422(4), respectively) in order to acquire (i.e., access) five fourth sum of partial products values 423(4) stored in the fourth DA LUT 421(4) at the addressed locations. The higher order address generator 412 can also generate a standard binary, 4 b fourth adjustment address from a group of MSBs of the fourth group and can process that standard binary, 4 b fourth adjustment address (e.g., convert or map it to an offset binary, 4 b fourth adjustment address 425(4)) in order to acquire a fourth adjustment value 426(4) stored in the fourth adjustment LUT 424(4) at the addressed location.

It should be noted that for all but the next-to-MSB position addresses for each of the DA LUTs 421(1)-(4) described above, the address generators 411-412 combined same-position bits (i.e., all LSBs, all next-to-LSBs, etc.) in sequential order to form the corresponding DA LUT address. However, to compensate for a magnitude reduction in the final output, due to this dropping of the MSBs when generating DA LUT addresses, for each next-to-MSBs position address, the next-to-MSBs are modified to their inverted value before being combined to form the corresponding DA LUT address. All other bit values (e.g., the LSBs, the next-to-LSBs, etc.) remain unchanged when generating corresponding DA LUT addresses.

Those skilled in the art will recognize that the filter coefficients $A_n$ used in the modified DA equation computations (i.e., the sum of partial products computations and the correction plus offset computations) for the lower order taps (i.e., taps −3 to 7) will be greater than those used in the same computations for the higher order taps. Thus, the sum of partial products values output by the DA LUTs in the lower order set 491 will be larger than those output by the DA LUTs in the higher order sets 491. For example, in the exemplary embodiment shown in FIG. 4, the first DA LUT 421(1) can output 9 b words representing the first sum of partial products values 423(1); the second DA LUT 421(2) can output 8 b words representing the second sum of partial products values 423(2); the third DA LUT 421(3) can output 7 b words representing the third sum of partial products values 423(3); and the fourth DA LUT 421(4) can also output 7 b words representing the fourth sum of partial products values 423(4).

This DAFFE 400 can further include downstream adder logic including, but not limited to, hierarchical adders 451-453, which in combination compute a total sum of the first sum of partial products values 423(1) acquired from the first DA LUT 421(1), the first adjustment value 426(1) acquired from the first adjustment LUT 424(1), the second sum of partial products values 423(2) acquired from the second DA LUT 421(2), the second adjustment value 426(2) acquired from the second adjustment LUT 424(2), the third sum of partial products values 423(3) acquired from the third DA LUT 421(3), the third adjustment value 426(3) acquired from the third adjustment LUT 424(3), the fourth sum of partial products values 423(4) acquired from the fourth DA LUT 421(4), and, finally, the fourth adjustment value 426(4) acquired from the fourth adjustment LUT 424(4) to solve the modified DA equation (11) above.

Specifically, a first adder 451 (e.g., a first carry-save addition (CSA) tree circuit) or series of first adders can add together the first sum of partial products values 423(1) acquired from the first DA LUT 421(1), the first adjustment value 426(1) acquired from the first adjustment LUT 424(1), the second sum of partial products values 423(2) acquired from the second DA LUT 421(2), and the second adjustment value 426(2) acquired from the second adjustment LUT 424(2). It should be noted that only one offset value is included to account for the use of the binary offset format when processing the lower order taps. Thus, as mentioned above, the second adjustment value 426(2) acquired from the second adjustment LUT 424(2) will only include the outcome of a correction computation (with the offset at zero). A second adder 452 (e.g., a second CSA tree circuit) or series of second adders can add together the third sum of partial products values 423(3) acquired from the third DA LUT 421(3), the third adjustment value 426(3) acquired from the third adjustment LUT 424(3), the fourth sum of partial products values 423(4) acquired from the fourth DA LUT 421(4), and, finally, the fourth adjustment value 426(4) acquired from the fourth adjustment LUT 424(4). It should be noted that only one offset value is included to account for the use of the binary offset format when processing the higher order taps also. Thus, as mentioned above, the fourth adjustment value 426(4) acquired from the fourth adjustment LUT 424(2) will only include the outcome of a correction computation (with the offset at zero). At least one third adder 453 (e.g., a Kogge-Stone adder (KSA), also referred to as a carry look-ahead adder) can add together the sums output from the first adder(s) 451 and second adder(s) 452 and can output, at an output node 480 of the DAFFE 400, the answer to modified DA equation in the form of a 9 b word.

It should be noted that pipeline flop registers (not shown) can be inserted between the hierarchical adders 451-453 in order to maintain proper timing and, particularly, in order to maintain the C8 clock whose frequency is one eighth the incoming bit rate, C1 throughout the DAFFE 400.

It should also be noted that in the disclosed DA FEE 400 embodiments, the adjustment values that are acquired from the adjustment LUTs and added into the final output by the adders 451-453 compensate for the reduction in size of the associated DA LUTs due to dropping of the MSBs and the use of the offset binary format, respectively. Additionally, it should be noted that this DAFFE configuration and, particularly, the reduced number of sum of partial products values acquired from each of the DA LUTs due to the dropping of the MSBs when generating the DA LUT addresses, allows for a corresponding reduction in the complexity of the downstream adder logic (e.g., adder(s) 451-453) and, thereby a corresponding reduction in power consumption when processing the data from the DA LUTs.

Figure 6:
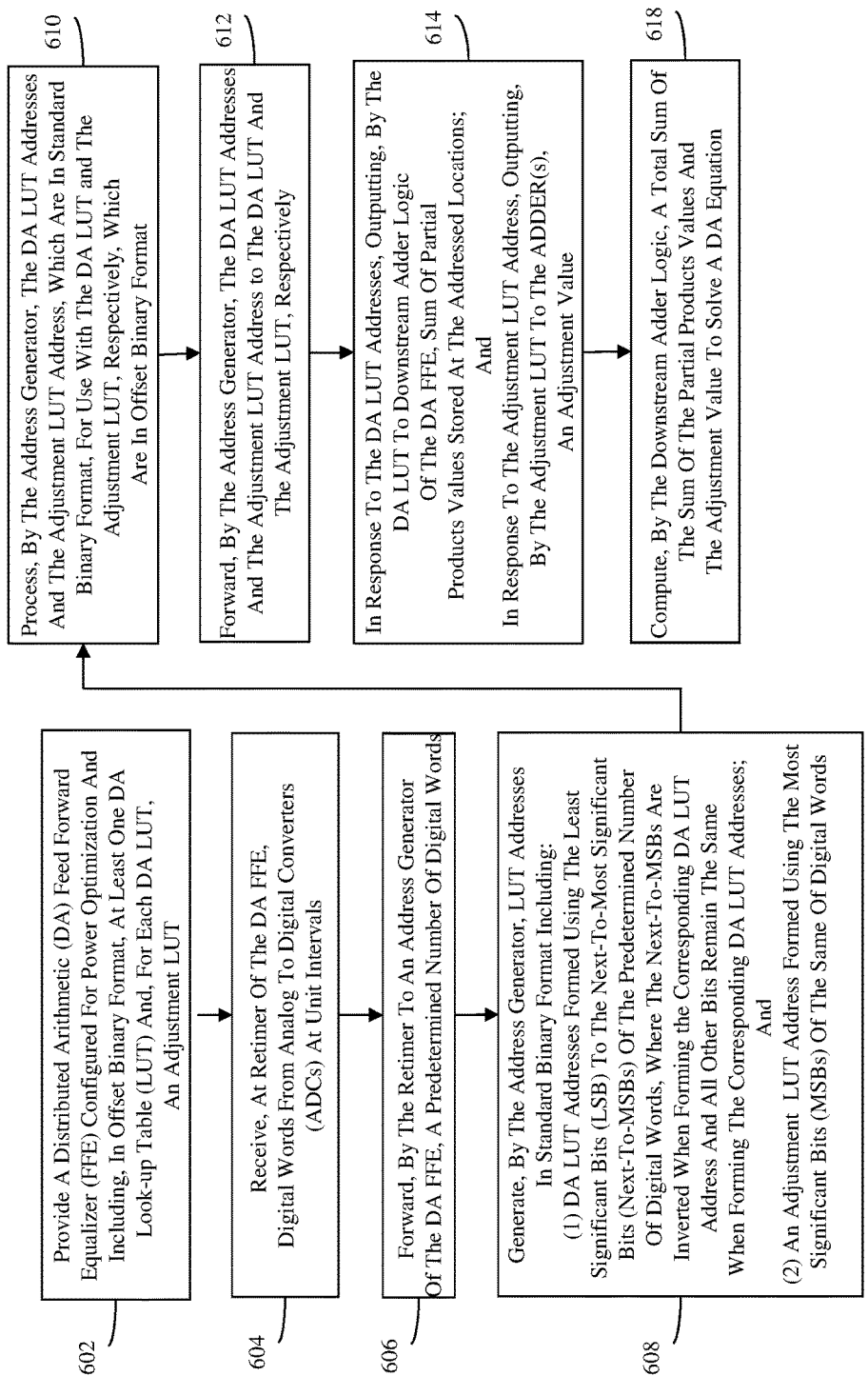
FIG. 6 is a flow diagram illustrating an embodiment of an associated equalization method.

Referring to the flow diagram of FIG. 6, also disclosed herein are corresponding feed forward equalization methods employing such a power-optimized distributed arithmetic (DA) architecture.

The method embodiments disclosed herein can include providing a distributed arithmetic (DA) feed forward equalizer (FFE) (see process 602). The DAFFE can, for example, be configured as the DAFFE 300 described above and illustrated in FIG. 3, as the DAFFE 400 described above and illustrated in FIG. 4, or alternatively as any other DAFFE structure that has the above-described DAFFE features employed to reduce power consumption. For purposes of illustration, the method steps are described in greater detail below with respect to the general DAFFE 300 structure shown in FIG. 3.

The DAFFE provided at process step 602 can be incorporated into a receiver (RX), such as a level-4 pulse amplitude modulation (PAM-4) data receiver, to correct for signal degradation. Specifically, the RX can include analog-to-digital converters (ADCs), which receive an analog signal transmitted from a transmitter (TX), convert the received signal from analog to digital, and output digital words in standard binary format to the DAFFE. These digital words can have an equal number of bits. That is, they can all be N-bit digital words.

The DAFFE provided at process step 602 can further include at least one set of look-up tables (LUTs) in offset binary format. That is, the LUTs can be configured to be indexed using addresses in offset binary format as opposed to standard binary format (also referred to herein as two's complement format). Those skilled in the art will recognize that in the standard binary format signal data is represented by a digital word containing bits of 0's and 1's and the most significant bit (MSB) in the digital word will indicate signal polarity besides magnitude. For example, a 0 MSB can represent positive signal polarity and a 1 MSB can represent negative signal polarity. Offset binary format instead refers to a digital coding scheme where all-zero corresponds to the minimal negative value and all-one to the maximal positive value. In any case, the set of LUTs can include at least one DA look-up table (LUT) 321 and at least one adjustment LUT 324 for each DA LUT 321. As discussed above, the DA LUT 321 can store pre-calculated possible outcomes for sum of partial products computations (i.e., pre-calculated sum of partial products values) and the corresponding adjustment LUT 324 can store pre-calculated possible outcomes for correction plus offset computations. These possible outcomes for the sum of partial products values and the possible outcomes for the correction plus offset computations are included to allow the DAFFE 300 to solve a DA equation (see the above-discussion of DA equation (3), see also the above-discussion of DA equation (11)).

In operation, the method can further include receiving, at a retimer 302 of the DAFFE 300 at an input 301, digital inputs (i.e., N-bit digital words) from ADCs at successive unit intervals (UI) (see process step 604). The method can further include capturing and holding, by the retimer 302, the N-bit digital words until some predetermined number (e.g., X) of the digital words are sampled (i.e., held) (see process step 606). Once the predetermined number of digital words have been captured, the method can further include forwarding, by the retimer 302, the predetermined number of digital words as group to an address generator 310 of the DAFFE 300 for parallel feed forward equalization processing (see process step 608).

The method can further include receiving, by an address generator 310, the group of digital words from the retimer 302 (e.g., the X, N-bit digital words). Next, the method can include generating, by the address generator 310, LUT addresses for acquiring sum of partial products values and adjustment values from the above-mentioned LUTs. Specifically, method can include generating LUT addresses (including DA LUT addresses and an adjustment address) in standard binary format (see process step 608), processing these standard binary format LUT addresses for use with the offset binary LUTs (i.e., converting or mapping the standard binary LUT addresses to offset binary LUT addresses) (see process step 610) and then forwarding the DA LUT addresses and the adjustment LUT addresses to the DA LUT and the adjustment LUT, respectively (see process step 612).

More specifically, process step 608 of generating LUT addresses can include regrouping the received group of digital words and generating DA LUT addresses from a group of the least significant bits (LSBs) of the digital words through a group of next-to-most significant bits (next-to-MSBs) of the digital words, respectively. That is, when the predetermined number (X) of digital words is forwarded to the address generator 310, they can be decomposed. The most-significant bits (MSBs) are dropped. Then, a group of bits made up of the LSBs of the digital words are combined to form one X-bit DA LUT address, a group of bits made up of the next-to-LSBs of the same digital words are combined to form another X-bit DA LUT address, and so on until a group of bits made up of the next-to-MSBs of the same digital words are modified and then combined to form the last X-bit DA LUT address associated with that X digital words. As mentioned above, the MSB are dropped when generating DA LUT addresses. To compensate for a magnitude reduction in the final output, due to this dropping of the MSBs when generating the DA LUT addresses, the next-to-MSBs are specifically modified to their inverted value before being combined to form the corresponding DA LUT address for the next-to-MSB position. All other bit values (e.g., the least-significant-bits (LSBs), the next-to-LSBs, etc.) remain unchanged when generating corresponding DA LUT addresses.

Process step 608 can further include using the most significant bits (MSBs), which represent signal polarity, when generating the adjustment LUT address. Specifically, to generate an X-bit adjustment LUT address at process 608 a group of bits made up of the most significant bits (MSBs) of the same digital words that were used to form the X-bit DA LUT addresses are combined.

At process steps 610-612, standard binary X-bit DA LUT addresses can be converted into addresses with recognition of offset binary representation of sum of partial products values in LUT 321 and can be forwarded to the DA LUT 321 for processing. Similarly, the standard binary X-bit adjustment address can be converted to an X-bit adjustment address 325 so as to recognize the offset binary representation in the LUT 324 and can be forwarded to the adjustment LUT 324 for processing.

The method can further include, in response to the X-bit DA LUT addresses 322 (which are received as discrete inputs to the DA LUT 321), outputting, by the DA LUT 321 to downstream adder logic (e.g., see adder(s) 350), sum of partial products values 323 stored in the addressed locations (see process step 614). The method can further include, in response to the X-bit adjustment LUT address 325 (which is received by the adjustment LUT as an input), outputting, by the adjustment LUT 324 to the downstream adder logic, an adjustment value 326 stored at the addressed location (see also process step 614).

The method can further include computing, by the downstream adder logic (e.g., by adder(s) 350), the total sum of the sum of the partial products values 323 acquired from the DA LUT 321 and the adjustment value 326 acquired from the adjustment LUT 324 in order to correctly solve the DA equation (see process step 618).

Embodiments of the disclosed method can further include operating multiple DAFFE slices (as described above) in parallel to process different groups of digital inputs (e.g., from substantially over lapping sub-sets of analog-to-digital converters (ADCs) within a larger set of ADCs). Embodiments of the disclosed method can also include employing multiple sets of the above-described LUTs in a single DAFFE slice to allow for parallel processing of relatively small groups of digital inputs, which have been sampled from a given sub-set of the larger set of ADCs.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, it should be understood that the descriptions of operations performed by the disclosed structure or component thereof are not intended to be limiting (unless otherwise indicated). For example, when a structure or component thereof is described above or claimed as performing a given operation (e.g., receiving, capturing, holding, forwarding, processing, generating, computing, etc.), then it should be understood that the structure or component thereof is configured to perform that given operation (i.e., adapted to perform that given operation) and may also be configured to perform (i.e., adapted to perform) other operations. It should also be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A feed forward equalizer comprising:
   a distributed arithmetic look-up table storing possible outcomes for sum of partial products computations;
   an adjustment look-up table storing possible outcomes for correction plus offset computations; and
   an address generator configured to receive a predetermined number of digital words,
      the address generator configured to generate distributed arithmetic look-up table addresses from a group of least significant bits of the digital words through a group of next-to-most significant bits of the digital words, respectively, to acquire sum of partial products values from the distributed arithmetic look-up table, and
      the address generator configured to generate an adjustment look-up table address from a group of most significant bits of the digital words to acquire an adjustment value from the adjustment look-up table.

2. The feed forward equalizer of claim 1, wherein next-to-most significant bit values are inverted when generating a corresponding distributed arithmetic look-up table address and wherein all other bit values remain unchanged when generating corresponding distributed arithmetic look-up table addresses.

3. The feed forward equalizer of claim 1,
   wherein all look-up tables are in offset binary format, and
   wherein the address generator initially generates all addresses in standard binary format and then processes the addresses to facilitate use with the look-up tables in the offset binary format.

4. The feed forward equalizer of claim 3, further comprising at least one adder configured to compute a sum of the sum of partial products values and the adjustment value to solve a distributed arithmetic equation, wherein dropping most significant bits when forming the distributed arithmetic look-up table addresses decreases a number of sum of partial products values acquired from the distributed arithmetic look-up table, allowing for a reduction in downstream adder logic complexity and a corresponding reduction in power consumption when solving the distributed arithmetic equation.

5. The feed forward equalizer of claim 4, wherein the adjustment value accounts for the dropping of the most significant bits from the digital words when forming the distributed arithmetic look-up table addresses and using of the offset binary format in order to correctly solve the distributed arithmetic equation.

6. The feed forward equalizer of claim 1, further comprising:
   at least one first set of distributed arithmetic and adjustment look-up tables for lower order taps; and at least one second set of distributed arithmetic and adjustment look-up tables for higher order taps.

7. The feed forward equalizer of claim 6, wherein any sum of partial products values acquired from any distributed arithmetic look-up table in the first set is wider than any sum of partial products values acquired from any distributed arithmetic look-up table in the second set.

8. The feed forward equalizer of claim 1, wherein the digital words are outputs of analog-to-digital converters.

9. The feed forward equalizer of claim 1, further comprising a retimer configured to receive digital words at successive unit intervals, to hold the digital words until the predetermined number are received, and to forward the predetermined number of the digital words to the address generator for parallel feed forward equalization processing.

10. A feed forward equalizer comprising:
a lower order set of look-up tables comprising at least:
a first digital arithmetic look-up table storing first possible outcomes for first sum of partial products computations;
a first adjustment look-up table storing first possible outcomes for first correction plus offset computations;
a second distributed arithmetic look-up table storing second possible outcomes for second sum of partial products computations; and
a second adjustment look-up table storing second possible outcomes for second correction computations only;
a lower order address generator configured to receive eight digital words,
the lower order address generator configured to generate first distributed arithmetic look-up table addresses from a group of least significant bits of a first group of four of the eight digital words received by the lower order address generator through a group of next-to-most significant bits of the first group, respectively, to acquire first sum of partial products values from the first distributed arithmetic look-up table,
the lower order address generator configured to generate a first adjustment look-up table address from a group of most significant bits of the first group to acquire a first adjustment value from the first adjustment look-up table,
the lower order address generator configured to generate second distributed arithmetic look-up table addresses from a group of least significant bits of a second group of four of the eight digital words received by the lower order address generator through a group of next-to-most significant bits of the second group, respectively, to acquire second sum of partial products values from the second distributed arithmetic look-up table, and
the lower order address generator configured to generate a second adjustment look-up table address from a group of most significant bits of the second group to acquire a second adjustment value from the second adjustment look-up table;
a higher order set of look-up tables comprising at least:
a third distributed arithmetic look-up table storing third possible outcomes for third sum of partial products computations;
a third adjustment look-up table storing third possible outcomes for third correction plus offset computations;
a fourth distributed arithmetic look-up table storing fourth possible outcomes for fourth sum of partial products computations; and
a fourth adjustment look-up table storing fourth possible outcomes for fourth correction computations only;
a higher order address generator configured to receive another eight digital words,
the higher order address generator configured to generate third distributed arithmetic look-up table addresses from a group of least significant bits of a third group of four of the eight digital words received by the higher order address generator through a group of next-to-most significant bits of the third group of, respectively, to acquire third sum of partial products values from the third distributed arithmetic look-up table,
the higher order address generator configured to generate a third adjustment look-up table address from a group of most significant bits of the third group to acquire a third adjustment value from the third adjustment look-up table,
the higher order address generator configured to generate fourth distributed arithmetic look-up table addresses from a group of least significant bits of a fourth group of four of the digital words received by the higher order address generator through a group of next-to-most significant bits of the fourth group, respectively, to acquire fourth sum of partial products values from the fourth distributed arithmetic look-up table, and
the higher order address generator configured to generate a fourth adjustment look-up table address from a group of most significant bits of the fourth group to acquire a fourth adjustment value from the fourth adjustment look-up table; and
adders configured to compute a total sum of the first sum of partial products values, the first adjustment value, the second sum of partial products values, the second adjustment value, the third sum of partial products values, the third adjustment value, the fourth sum of partial products values and the fourth adjustment value to solve a distributed arithmetic equation.

11. The feed forward equalizer of claim 10, wherein next-to-most significant bit values are inverted when generating a corresponding distributed arithmetic look-up table address and wherein all other bit values remain unchanged when generating corresponding distributed arithmetic look-up table addresses.

12. The feed forward equalizer of claim 10,
wherein all look-up tables in the lower order set and the higher order set are in offset binary format, and
wherein all address generators initially generate addresses in standard binary format and then process the addresses for use with the look-up tables in the offset binary format.

13. The feed forward equalizer of claim 12, wherein dropping most significant bits when forming all distributed arithmetic look-up table addresses decreases the number of sum of partial products values acquired from the distributed arithmetic look-up tables, allowing for a reduction in downstream adder logic complexity and a corresponding reduction in power consumption when solving the distributed arithmetic equation.

14. The feed forward equalizer of claim 13, wherein adjustment values account for the dropping of the most significant bits from the digital words when forming the distributed arithmetic look-up table addresses and using of the offset binary format in order to correctly solve the distributed arithmetic equation.

15. The feed forward equalizer of claim 10, wherein the first sum of partial products values and the second sum of partial products values are wider than the third sum of partial products values and the fourth sum of partial products values.

16. The feed forward equalizer of claim 10, further comprising a retimer configured to receive digital words at successive unit intervals, to hold received digital words until a first eight are received, to forward the first eight to the lower order address generator for parallel feed forward equalization processing, to again hold received digital words until a next eight are received, and to forward the next eight to the higher order address generator for parallel feed forward equalization processing.

17. A method comprising
generating, by an address generator of a feed forward equalizer, distributed arithmetic look-up table addresses and an adjustment look-up table address,
wherein the distributed arithmetic look-up table addresses are generated from a group of least significant bits of a predetermined number of digital words through a group of next-to-most significant bits of the digital words, respectively, and forwarded to a distributed arithmetic look-up table that stores possible outcomes for sum of partial products computations, and
wherein the adjustment look-up table address is generated from a group of most significant bits of the digital words and forwarded to an adjustment look-up table that stores possible outcomes for correction plus offset computations;
in response to the distributed arithmetic look-up table addresses, outputting, by the distributed arithmetic look-up table, to at least one adder, sum of partial products values;
in response to the adjustment look-up table address, outputting, by the adjustment look-up table to the at least one adder, an adjustment value; and
computing, by the at least one adder, a sum of the sum of partial products values and the adjustment value to solve a distributed arithmetic equation.

18. The method of claim 17, wherein next-to-most significant bit values are inverted when generating a corresponding distributed arithmetic look-up table address and wherein all other bit values remain unchanged when generating corresponding distributed arithmetic look-up table addresses.

19. The method of claim 17,
wherein all look-up tables are in offset binary format, and
wherein all addresses are initially generated in standard binary format and then processed for use in the look-up tables in the offset binary format.

20. The method of claim 17, wherein dropping of the most significant bits from the digital words when generating the distributed arithmetic look-up table addresses decreases a number of sum of partial products values acquired from the distributed arithmetic look-up table, allowing for a reduction in downstream adder logic complexity and a corresponding reduction in power consumption when solving the distributed arithmetic equation.

* * * * *